United States Patent [19]

Nakagawa et al.

[11] Patent Number: 4,706,249
[45] Date of Patent: Nov. 10, 1987

[54] SEMICONDUCTOR MEMORY DEVICE HAVING ERROR DETECTION/CORRECTION FUNCTION

[75] Inventors: Kaoru Nakagawa; Mitsugi Ogura, both of Yokohama; Kenji Natori, Kawasaki; Fujio Masuoka, Yokohama, all of Japan

[73] Assignee: Kabushiki Kaisha Toshiba, Kawasaki, Japan

[21] Appl. No.: 804,177

[22] Filed: Dec. 3, 1985

[30] Foreign Application Priority Data

Dec. 4, 1984 [JP] Japan ................................. 59-256150

[51] Int. Cl.$^4$ ............................................ G06F 11/10
[52] U.S. Cl. .......................................... 371/38; 371/51
[58] Field of Search ............................. 371/38, 13, 51; 364/200 MS File, 900 MS File

[56] References Cited

U.S. PATENT DOCUMENTS

| 3,836,957 | 9/1974 | Duke ...................................... 371/38 |
| 4,058,851 | 11/1977 | Scheuneman ...................... 371/10 X |
| 4,296,494 | 10/1981 | Ishikawa ........................... 371/38 X |
| 4,336,611 | 6/1982 | Bernhardt ............................ 371/38 |
| 4,412,314 | 10/1983 | Proebsting ........................ 371/13 X |
| 4,461,003 | 7/1984 | Tamaki ............................... 371/14 X |
| 4,493,081 | 1/1985 | Schmidt ................................ 371/38 |

OTHER PUBLICATIONS

Osman, "Error-Correction Technique for Random-Access Memories," IEEE Journal of Solid-State Circuits, vol. SC-17, No. 5, Oct. 1982.

Primary Examiner—Jerry Smith
Assistant Examiner—Robert W. Beausoliel, Jr.
Attorney, Agent, or Firm—Finnegan, Henderson, Farabow, Garrett & Dunner

[57] ABSTRACT

In the semiconductor memory device of the invention, a normal voltage detecting circuit and a high voltage detecting circuit are connected to a terminal for the purpose of receiving a write enable signal. When a signal of normal level is supplied to the terminal, the circuit controls data read or write with respect to a memory cell array in accordance with the level of the write enable signal. An error correction code circuit is rendered operative, and a soft error generated in data read from the memory cell array is corrected. When a high voltage is applied to the terminal, the circuit sets the memory device in the read mode. The circuit detects application of the high voltage to the terminal and supplies a predetermined signal to an ECC control circuit. In response to the signal, the ECC control circuit stops the operation of the ECC circuit. Data without any correction of soft errors is output from the memory device, and testing of hard errors is simplified.

12 Claims, 8 Drawing Figures

SEMICONDUCTOR MEMORY DEVICE HAVING ERROR DETECTION/CORRECTION FUNCTION

BACKGROUND OF THE INVENTION

The present invention relates to an improvement in a semiconductor memory device having an error correction code (ECC) circuit with a function of detecting and correcting an error in data.

Semiconductor memory devices are becoming increasingly more integrated these days. For this reason, a MOS capacitor in a dynamic memory device must have a small capacity. As a result, the probability of causing a soft error due to alpha rays is high. With the trend for higher integration, the problem of soft errors is also encountered in static memory devices.

As a countermeasure against soft errors, it has been proposed to use an ECC circuit in a memory chip. The ECC circuit performs a parity check of data read out from memory cells. The ECC circuit then corrects the data in accordance with the parity check results. Such an ECC circuit in a memory device is described in, e.g., "Self-Correction Circuit in 1Mb DRAM" in Semiconductors/Transistors, Report of the Institute of Electronics and Communication Engineers of Japan, pp. 51 to 58, particularly with reference to FIG. 11.

For practical reasons ECC circuits most frequently have a configuration facilitating detection and correction of a 1-bit error.

The memory circuit operation must be tested during the die sorting process in the wafer stage or during the burn process, after packaging. In the operation test, the ECC circuit prevents easy detection of hard errors. More specifically, even if a hard error is present, the ECC circuit corrects it. Then, the hard error remains non-detected and reliability of the memory cell is degraded.

In view of this problem, it may be proposed to use an ECC circuit for detecting and correcting an error of 2 bits or more. However, an ECC circuit having a configuration for detecting an error of 2 bits or more is too complicated. It is, therefore, impractical to use a 2-bit ECC circuit in mass-produced memory devices.

When a memory device having an ECC circuit is operated, a memory cell array must be initialized. When the function of the ECC circuit is effective during this initialization, a complex initialization circuit is required. Such a complex initialization circuit adversely influences the performance and reliability of the memory device through its need of a wide element area that serves to reduce the packing density of the memory device.

SUMMARY OF THE INVENTION

It is an object of the present invention to provide a semiconductor memory device which can operate an ECC circuit as needed.

In order to achieve the above object of the present invention, there is provided a semiconductor memory device comprising:

a memory cell array (27) consisting of a plurality of memory cells for storing data;

means (23) for generating parity data of data to be stored in the memory cell array (27);

means (25) for reading out the data stored in the memory cell array (27);

error correcting means consisting of parity check means (29, 31) for performing a parity check of data and parity data read out from the memory cell array (27), and corrected data generating means (33) for correcting an error of the data read out from the memory cell array (27) based on an output from the parity check means (29, 31), and generating corrected data; and control means, responsive to a control signal, for selectively controlling the error correcting means (29, 31) in a first operation mode for correcting an error bit of the data read out by the readout means (25) and outputting corrected data, and, in a second operation mode, for directly outputting the data read out by the readout means (25).

With the device of the configuration described above, a hard error test can be performed without operating the error correcting means. Therefore, any hard error in the device can be easily and reliably detected. In the normal mode, the error correcting means is operated so as to correct soft errors, thereby improving reliability of the memory device. Furthermore, the memory device can be easily initialized when the error correcting means is deactivated. A complex initialization circuit is not required, and the packing density of the memory device can be increased.

DETAILED DESCRIPTION OF THE PREFERRED EMBODIMENT

Figure 1:
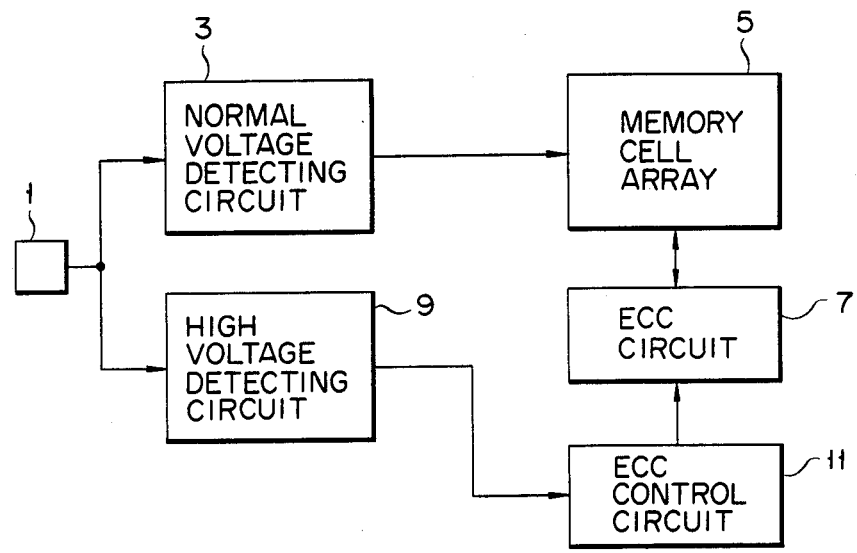
FIG. 1 is a block diagram schematically showing the configuration of a memory device according to an embodiment of the present invention.

A preferred embodiment of the present invention will now be described with reference to the accompanying drawings. More specifically, the concept of a semiconductor memory device according to an embodiment of the present invention will be described with reference to FIG. 1. A normal external signal, e.g., a write enable signal $\overline{WE}$ is applied to a terminal 1. Signal $\overline{WE}$ in L level indicates, the memory chip is in the write mode. The terminal 1 corresponds to a pad in the wafer stage and an external terminal after packaging. In the memory operation test, a voltage different from the normal, external signal (e.g., a voltage sufficiently higher than the normal, external voltage) is applied to the terminal 1.

A normal voltage detecting circuit 3 is connected to the terminal 1. The circuit 3 detects application of a voltage of normal level (e.g., 0 V for level "0" and 5 V for level "1"), and controls the operation of a memory cell array 5 and its peripheral circuits. An ECC circuit 7 for correcting an error in input/output data of the array 5 is connected to the circuit 3. A high voltage detecting circuit 9 is connected to the terminal 1. The circuit 9 detects application of a high voltage to the terminal 1. An ECC circuit function selection control circuit 11 is connected to the circuit 9. The circuit 11 stops the operation of the ECC circuit 7 when the detection result of the circuit 9 indicates that a high voltage is applied to the terminal 1. The circuit 11 allows the ECC circuit 7 to operate when a normal level signal is applied to the terminal 1.

With the device of the above configuration, the ECC circuit 7 can be selectively operated or stopped in accordance with the type of voltage applied to the terminal 1. Therefore, the ECC circuit 7 can be stopped during testing of the memory cell operation. Hard errors of the memory cell and soft error rates of the device can be checked without the ECC circuit. However, in the normal mode, the ECC circuit 7 can be operated to allow normal operation of the memory device, and reliability of the memory device against soft errors can be improved. When the memory device is initialized while the ECC circuit 7 is stopped, intialization can be performed easily. A special initialization circuit is not required.

The configuration and operation of the circuit shown in FIG. 1 will be described in more detail with reference to FIG. 2. In the memory device shown in FIG. 2, data is exchanged in units of 4 bits within the device. In FIG. 2, only a corrected data generating circuit 33 (to be described later) is illustrated with 4-bit data lines to explain its detailed configuration, and any other circuit for data exchange is illustrated by buses.

Referring to FIG. 2, an input buffer 21 receives input data. Output data from the input buffer 21 is supplied to the first input terminals of an updated data generating circuit 23. Output data from the circuit 23 is supplied to a multiplexer circuit 25. The circuit 25 performs overall operations including data write in a memory cell array 27 (to be described later), data read from the array 27, selection of data to be written in the array 27, and selection of destination of data read out from the array 27. The circuit 25 is connected to the array 27, and the array 27 is itself connected to a selector 29. Output data from the selector 29 is supplied to a parity check circuit 31. Output signals from the circuit 31 are supplied to the circuit 33. A corresponding 2 out of 4 bits of output from the circuit 31 are supplied to the first and second input terminals of first to fourth 3-input AND gates 331 to 337 of the circuit 33. Output data from the AND gates 331 to 337 is supplied to one input terminal each of first to fourth exclusive (EX) OR gates 341 to 347.

Output data from the circuit 25 is also supplied to the circuit 33. Each data bit from the circuit 25 is supplied to the corresponding input terminal of the first to fourth EXOR gates 341 to 347. Output data from the EXOR gates 341 to 347 is supplied, as output data from the circuit 33, to an output buffer 35, the circuit 23 and the multiplexer circuit 25. The output buffer 35 converts input data into serial data and outputs it.

Figure 2:
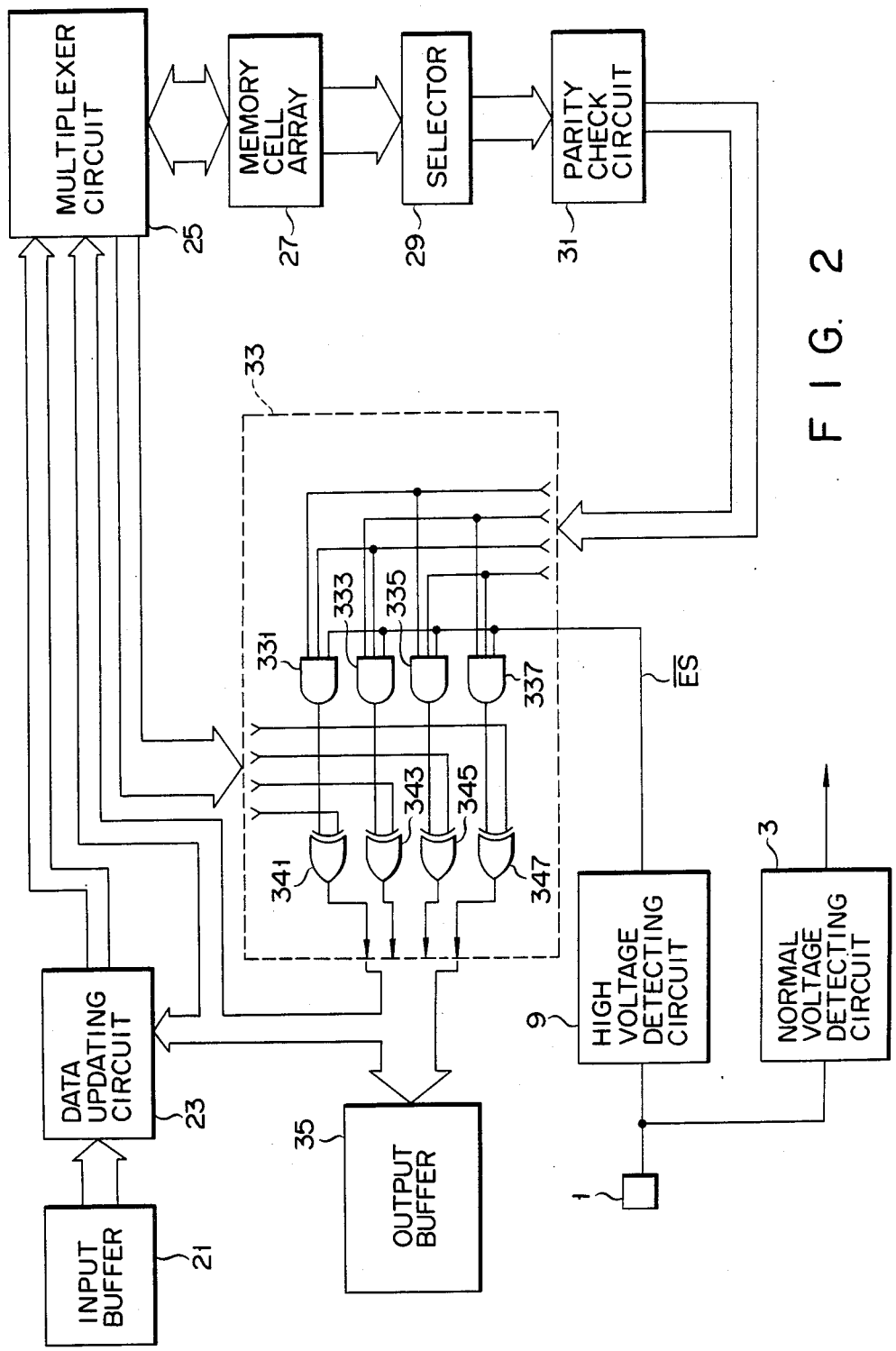
FIG. 2 is a circuit diagram showing in detail the configuration of the memory device shown in FIG. 1.

The terminal 1 shown in FIG. 1 is connected to the circuit 9. The output terminal of the circuit 9 is connected to the third input terminals of the AND gates 331 to 337. The terminal 1 shown in FIG. 1 is also connected to the circuit 3. An output signal from the circuit 3 is connected to a normal read/write control circuit (not shown). The read/write circuit controls operation of respective circuit parts including the circuits 23 and 25. Data write or read with respect to the memory device is thus performed.

Referring to FIG. 2, the selector 29 and the circuits 23, 31, and 33 constitute an ECC circuit. The operation of the memory device having the configuration shown in FIG. 2 will be described below. Data write in the memory device while the ECC circuit is operative will first be described. A write enable signal $\overline{WE}$ of level "0" (0 V) is supplied to the terminal 1. In response to this signal, the circuit 3 supplies a signal indicating the write mode to a control circuit (not shown) and the like. In response to this signal, the control circuit controls the respective circuit parts.

Write data is supplied to the updated data generating circuit 23 through the input buffer 21. The circuit 23 then performs, for example, a horizontal and vertical parity check of 9-bit input data, and outputs the 9-bit data with the 7 parity bits. The multiplexer circuit 25 supplies the data from the circuit 23 to the memory cell array 27 and writes the data in memory cells. Data write in the memory device is completed in this manner.

Operation of the memory device in the data read mode will be described. In the read mode, the signal $\overline{WE}$ of H level (5 V) is applied to the terminal 1. Data stored in the memory cell array 27 is supplied to the multiplexer circuit 25 and the selector 29. The multiplexer circuit 25 supplies 4-bit data read out from the array 27 to the corrected data generating circuit 33. The selector 29 reads out the 9-bit data and also reads out parity data, corresponding to the readout data from the array 27, and supplies the parity data to the parity check circuit 31. 16-bit data supplied to the circuit 31 is subjected to parity check. More specifically, a vertical and horizontal parity check of 4-bit data is first performed. Parity check results are compared with the parity check data read out from the array 27. When the comparison results indicate that the two data differ, an error bit is determined and a corresponding 4-bit signal is output. A 4-bit signal from the circuit 31 is supplied to the AND gates 331 to 337 in units of a corresponding 2 signals.

The high voltage detecting circuit 9 detects application of a signal of H level to the terminal 1 and generates a signal of level "1". The AND gates 331 to 337 AND the corresponding 2 signals of the output signals from the parity check circuit 31. The AND gates 331 to 337 supply signals of logic levels, corresponding to the ANDed results, to the EXOR gates 341 to 347. When output data from the AND gates 331 to 337 are "1", the corresponding bits are error bits.

The EXOR gates 341 to 347 EXOR the data from the multiplexer circuit 25 and the data from the AND gates 331 to 337. Thus, the data of an error bit in the non-corrected data is inverted. The data received from the multiplexer circuit 25 is corrected. The corrected data is supplied to the output buffer 35. The output buffer 35 converts the input data into serial data and outputs the serial data. The corrected data is also supplied to the updated data generating circuit 23. The circuit 23 adds the parity bits to the corrected data from the circuit 33 and supplies the resultant data to the multiplexer circuit 25. The circuit 25 writes the data in the array 27, thus completing data read from the memory device.

Operation of the memory device in the refresh mode will now be described below. Data read out from the array 27 is subjected to correction of a soft error by the selector 29 and the circuits 23, 25, 31 and 33. The corrected data and the updated parity data are supplied to the circuit 25 and written in the array 27, completing memory refresh.

The operation of the memory device while the ECC circuit is rendered inoperative will now be described. A high voltage (e.g., 12 V) is applied to the terminal 1. (This voltage is not used when the memory device is in the normal mode.) When the high voltage is applied to the terminal 1, the normal voltage detecting circuit 3 sets the memory device in the read mode. Then, the high voltage detecting circuit 9 detects application of a high voltage to the terminal 1 and generates a signal of level "0".

Data read out from the array 27 is supplied to the multiplexer circuit 25 and the selector 29 as in the normal read mode operation. The circuit 25 outputs the input data from the array 27. The circuit 31 generates 4 output signals. The circuit 9 detects application of a high voltage at the terminal 1 and generates a signal of level "0". Therefore, all the AND gates 331 to 337 are disabled and output data "0". The EXOR gates EXOR the data "0" with the data from the circuit 25. The EXOR gates 341 to 347 directly output data (non-corrected data) from the circuit 25. Thus, data read out from the array 27 is output from the output buffer 35 without its having been changed.

With this memory device, when a high voltage is applied to the terminal 1 before the device is shipped from the factory, the memory contents can be read out while the ECC circuit is rendered inoperative. Therefore, a hard error and soft error rates of the memory device can be checked. Data write for testing the device can be performed in the normal data write mode. Reliability of the memory device can thus be improved. In the normal mode, the ECC circuit operates and, as a result, reliability of the memory device against soft errors is improved.

Figure 3:
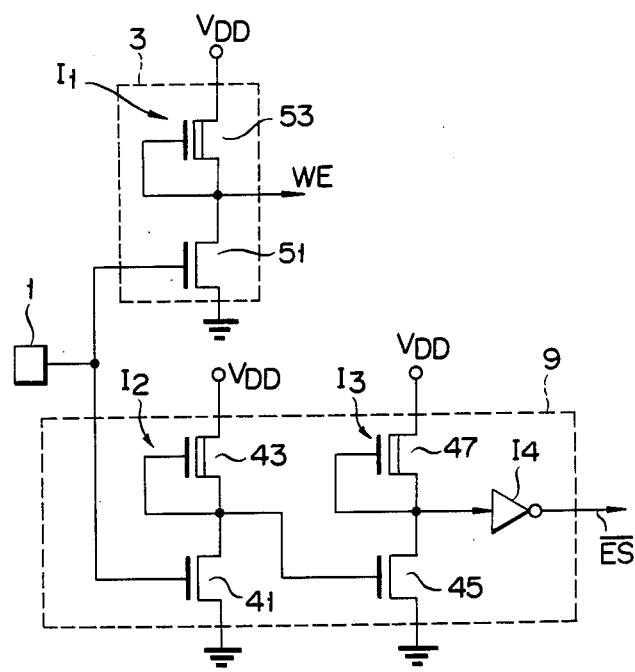
FIG. 3 is a circuit diagram showing the configuration of the normal and high voltage detecting circuits shown in FIG. 1.

Examples of the normal and high voltage detecting circuits 3 and 9 will be described with reference to FIG. 3. The gate of a MOS transistor 41 is connected to the terminal 1. One end of the current path of the transistor 41 is grounded. The other end of the current path of the transistor 41 is connected to the gate and one end of the current path of a MOS transistor 43. The other end of the current path of the MOS transistor 43 is connected to a terminal (to be referred to as VDD terminal hereinafter) kept at a predetermined potential.

The node between the transistors 41 and 43 is connected to the gate of a MOS transistor 45. One end of the current path of the transistor 45 is grounded. The other end of the current path of the transistor 45 is connected to the gate and one end of the current path of a MOS transistor 47. The other end of the current path of the transistor 47 is connected to the VDD terminal. The node between the transistors 45 and 47 is connected to the input terminal of an inverter I4. The terminal 1 is also connected to the gate of a MOS transistor 51. One end of the current path of the transistor 51 is grounded. The other end of the current path of the transistor 51 is connected to the gate and one end of the current path of a MOS transistor 53. The other end of the current path of the MOS transistor 53 is connected to the VDD terminal.

Figure 4:
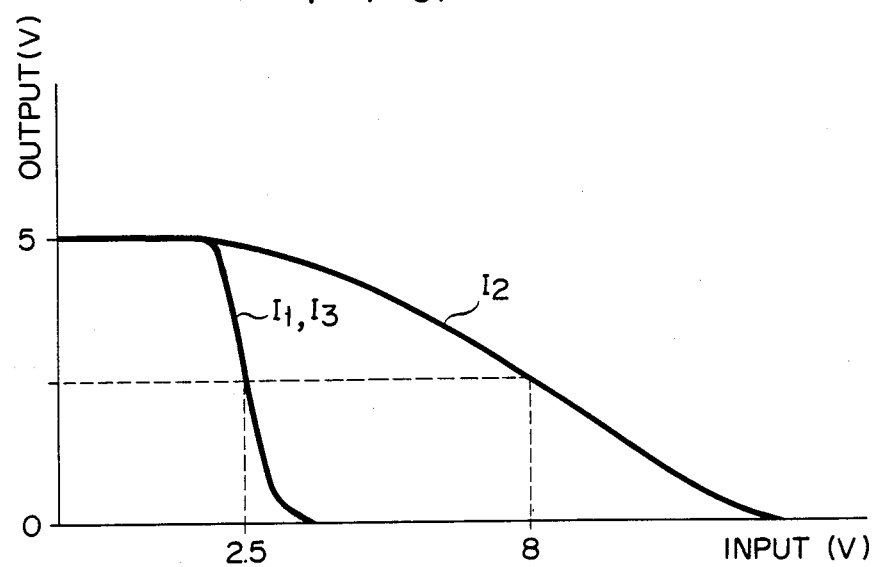
FIG. 4 is a graph explaining the mode of operation of the circuit shown in FIG. 3.

The transistors 51 and 53 constitute an E/D type inverter I1 for detecting a normal voltage. The threshold voltage of the inverter I1 is set at about 2.5 V, as shown in FIG. 4. The transistors 41 and 43 constitute an E/D type inverter I2 for detecting a high voltage. The threshold voltage of the inverter I2 is set at about 8 V, as shown in FIG. 4. The transistors 45 and 47 constitute an E/D inverter I3. The threshold voltage of the inverter I3 is set at about 2.5 V, as shown in FIG. 4.

When the signal $\overline{WE}$ is supplied to the terminal 1, the inverter I1 of the normal voltage detecting circuit 3 generates an inverted $\overline{WE}$ signal, the first inverter I2 in the circuit 9 generates a signal "1" and the second inverter I3 therein generates a signal "0". A signal of level "0" is supplied to an inverter I4. Then, the AND gates 331 to 337 shown in FIG. 2 are enabled and the ECC circuit is operated.

When a high voltage (12 V) is applied to the terminal 1, the inverter I1 is turned on and generates a signal of level "0". The memory device is set in the read mode. The inverter I2 of the high voltage detecting circuit 9 generates a signal of level "0" and the inverter I3 therein generates a signal of level "1". The inverter I4 outputs a signal $\overline{ES}$ of level "0". Data "0" is supplied to one input terminal each of the AND gates 331 to 337 shown in FIG. 2, and the AND gates 331 to 337 are disabled. The AND gates 331 to 337 output data "0", and the EXOR gates 341 to 347 directly output data from the circuit 25. The ECC circuit is rendered inoperative.

In this embodiment, a terminal for receiving a write enable signal $\overline{WE}$ is used as the terminal 1. However, another terminal can be used as the terminal 1.

Further, a single terminal need not be used both as the write/read switching terminal and the ECC circuit control terminal. A terminal only for ECC circuit function control can be used. The terminal 1 is directly connected to the write/read control circuit (not shown). As in the case of the normal memory device, the signal $\overline{WE}$ applied to the terminal 1 is directly supplied to the write/read control circuit. The terminal for ECC function control is directly connected to the AND gates 331 to 337. A signal for ECC circuit control is applied to the third terminals of the AND gates 331 to 337. The ECC circuit control signal can be a signal of normal voltage level but is not limited thereto.

In the above embodiment, when the high voltage is applied to the terminal 1 the memory device is automatically set in the read mode. However, when two separate terminals for read/write and ECC circuit function controls are used, the ECC circuit function can be stopped in both the read and write modes.

Figure 5:
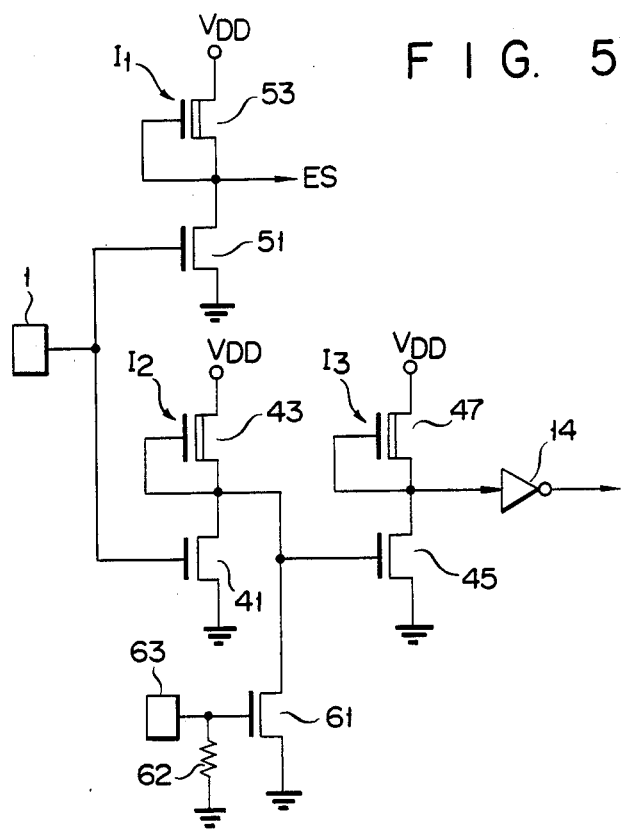
FIG. 5 is a circuit diagram of a modification of the circuit shown in FIG. 3.

The terminal 1 in the above embodiment is not only an external terminal of the memory device package but is an input/output pad in the wafer stage and an input-/output terminal after packaging. A pad can be formed on the wafer for receiving a signal of normal voltage level as a signal for controlling the ECC circuit function in the wafer stage. FIG. 5 shows examples of the normal and high voltage detecting circuits 3 and 9 when such a pad is used. Referring to FIG. 5, the same reference numerals as in FIG. 3 denote the same parts, and a detailed description thereof will be omitted. The circuit shown in FIG. 5 is different from that shown in FIG. 3 in that a MOS transistor 61 is inserted between the ground and the node between the second and third inverters I2 and I3, and a pad 63 is connected to the gate of the MOS transistor 61. Resister 62 is inserted between the pad 63 and the ground for keeping the voltage of the gate of the MOS transistor 61 to the level "0" when the pad 63 is open. The threshold voltage of the MOS transistor is set at about 2.5 V.

When a signal of level "1" is applied to the pad 63, the transistor 61 turns on and the output signal from the inverter I3 is set at level "1". Then, the ECC circuit is rendered inoperative. The pad 63 can be connected to a terminal different from the terminal 1 when the memory device is packaged. The memory device operates in substantially the same manner as a memory device having the two terminals as described above.

Figure 6:
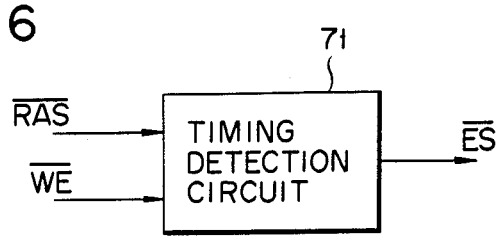
FIGS. 6 to 8 are circuit diagrams showing other configurations for stopping the operation of an ECC circuit.

The circuit configuration for generating a signal $\overline{ES}$ for stopping the ECC circuit operation is not limited to that described above. For example, input timing of the two signals applied to the package terminals can be controlled to generate the signal $\overline{ES}$. FIG. 6 shows an example of a circuit for outputting the signal $\overline{ES}$ based on the input timing of the two signals. The circuit shown in FIG. 6 comprises a timing detection circuit 71. The circuit 71 receives a signal $\overline{RAS}$ (chip enable signal) and a write enable signal $\overline{WE}$. In general, the signal $\overline{RAS}$ is supplied prior to the signal $\overline{WE}$. The circuit shown in FIG. 6 generates a signal $\overline{ES}$ when the signal $\overline{WE}$ is supplied prior to the signal $\overline{RAS}$. The types and input timings of the signals are not limited to those in this embodiment.

Figure 7:
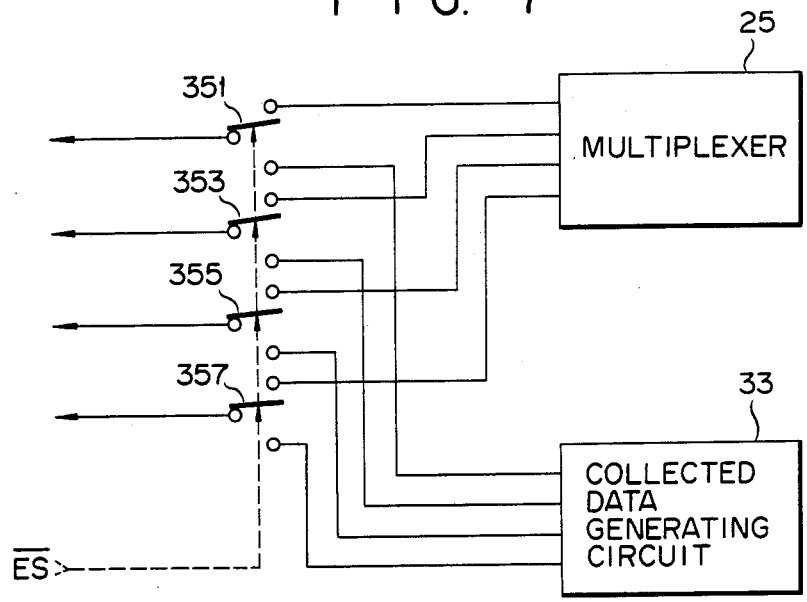

In the above embodiment, a signal $\overline{ES}$ of level "0" is supplied to one input terminal for each of the AND gates 331 to 337 for stopping the operation of the ECC circuit. The AND gates 331 to 337 are disabled and the ECC circuit is rendered inoperative. The present invention is not limited to this particular arrangement. For example, as shown in FIG. 7, data (non-corrected data) from the array 27, received through the multiplexer circuit 25, and the data (corrected data) from the circuit 33 can be selectively output. The signal $\overline{ES}$ serves as a control signal for switching switches 351 to 357. Note that the AND gates 331 to 337 can be 2-input AND gates.

Figure 8:
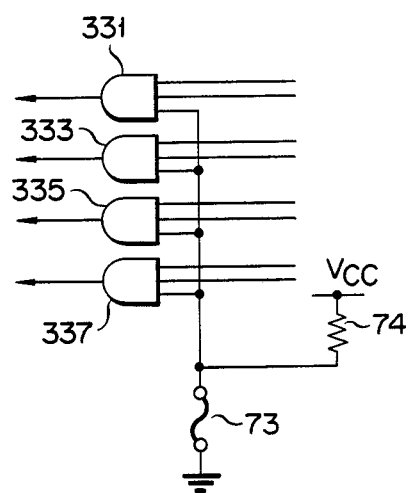

A circuit arrangement not using the signal $\overline{ES}$ can also be used. For example, as shown in FIG. 8, a fuse element 73 is connected between ground and the third input terminals of the AND gates 331 to 337. A resistor 74 is connected between the third input terminals and the power source voltage (VDD). The AND gates 331 to 337 are disabled until the fuse element 73 is disconnected. Therefore, a signal of level "0" is supplied to one input terminal each of the EXOR gates 341 to 347. The EXOR gates 341 to 347 then output data (non-corrected data) from the circuit 25 without its having been changed. While the fuse element 73 is connected, the memory device is checked for a hard error. After hard error testing is completed, the fuse element 73 is melted by a laser or the like. Thereafter, the ECC circuit operates normally. The ECC circuit cannot be stopped once the fuse element 73 is melted.

The configuration of the ECC circuit is not limited to that shown in FIG. 2. In the circuit shown in FIG. 2, the parity check circuit 31 performs a vertical and horizontal parity check. For this purpose, the corrected data generating circuit 33 has the configuration shown in FIG. 2. However, the ECC circuit is not limited to one having the parity check circuit 31 and the corrected data generating circuit 33 shown in FIG. 2, an ECC circuit having another configuration can also be used.

In the circuit shown in FIG. 2, data is handled in units of 4 bits. Therefore, output data from the circuits 31 and 33 also has 4 bits. The present invention is not limited to this, and can be similarly applied to a memory device having another bit configuration, e.g., 8 bits.

The method for stopping the operation of the ECC circuit is not limited to the above methods, and other methods can also be used. Nor is the present invention limited to a 1-chip, dynamic chip memory integrated circuit, it can also be applied to an on-chip memory such as the main memory of a 1-chip microcomputer.

What is claimed is:

1. A semiconductor memory device having an error detection/correction function, comprising:

a memory cell array consisting of a plurality of memory cells for storing data;

means for receiving data to be stored in said memory cell array, generating parity data of the data, and storing the data and the parity data in said memory cell array;

means for reading out the data and the corresponding parity data stored in said memory cell array;

error correcting means consisting of parity check means for performing a parity check of the data read out by said readout means, in accordance with the data and the corresponding parity data read out from said memory cell array by said readout means, amd corrected data generating means for correcting an error of the data and the corresponding parity data read out from said memory cell array in accordance with an output from said parity check means, and for outputting corrected data and corrected corresponding parity data; and control means, responsive to a control signal, for selectively controlling said error correcting means in a first operation mode for correcting an error of the data and the corresponding parity data read out by said readout means and outputting corrected data and corrected corresponding parity data, and, in a second operation mode, for outputting the data and the corresponding parity data from said readout means.

2. A memory device according to claim 1, wherein said memory device further comprises a pad on a semiconductor wafer, said control means is connected to said pad, and said control means is rendered operative in response to the control signal applied to said pad.

3. A memory device according to claim 1, wherein said memory device further comprises at least one external terminal, said control means is connected to said external terminal, and said control means is rendered operative in response to the control signal applied to said external terminal.

4. A memory device according to claim 1, wherein said control means receives a signal of a first voltage level, a signal of a second voltage level and a signal of a third voltage level, and sets said error correcting means in the second operation mode upon reception and detection of the signal of the first voltage level.

5. A memory device according to claim 1, wherein said control means receives first and second signals, and sets said error correcting means in the second operation mode upon reception of the first and second signals generated at timings which have a predetermined relationship.

6. A memory device according to claim 1, wherein said error correcting means further has error bit detecting means for detecting an error bit of the data and corresponding parity data read out from said memory cell array by said readout means, in accordance with the check result of said parity check means;

said corrected data generating means comprises means for inverting logical value of the error bit of the data and corresponding parity data read out from said memory cell array, in accordance with the detection result of said error bit detecting means; and said control means comprises means for controlling an operation of said error bit detecting means in response to the control signal.

7. A memory device according to claim 1, wherein said control means comprises a switch circuit for selectively outputting the data and corresponding parity data read out from said memory cell array by said readout means, and the corrected data and corresponding data from said correcting means, in response to the control signal.

8. A memory device according to claim 1, wherein:
said control means includes a single terminal, a first control circuit connected to said terminal, and a second control circuit connected to said terminal, said first control circuit generating a first control signal for controlling the memory device when the terminal receives an external signal at one of three voltage levels, and said second control circuit generating a second control signal for selectively controlling said error correcting means when said terminal receives the external signal.

9. A memory device according to claim 8, wherein:
said first control circuit comprises a first inverter circuit and said second control circuit comprises a second inverter circuit, said second inverter circuit outputting a disable signal at times when said correcting means operates in the second mode.

10. A memory device according to claim 8, wherein the memory device is fabricated in one chip.

11. A memory device according to claim 8, wherein:
the first control circuit sets the memory device in a write mode at times when the external signal is at a third voltage, and sets the memory device in a read mode at times when the external signal is at one of a first and a second voltage level; and
the second control circuit sets the error correcting means in the first operation mode at times when the external signal is at one of the second and a third voltage level, and sets the error correcting means in the second operation mode at times when the external signal is at the first voltage level.

12. A memory device according to claim 1, wherein:
said control means includes a cuttable fuse element having one end at a predetermined potential and another end connected to said error correcting means, the error correction means being connected to the predetermined potential and functioning in the second mode at times when the fuse is not cut and the error correction means not being connected to the predetermined potential and functioning in the first mode at times when the fuse is cut.

* * * * *

UNITED STATES PATENT AND TRADEMARK OFFICE
CERTIFICATE OF CORRECTION

PATENT NO. : 4,706,249

DATED : November 10, 1987

INVENTOR(S) : NAKAGAWA ET AL.

It is certified that error appears in the above-identified patent and that said Letters Patent is hereby corrected as shown below:

Claim 1, column 8, line 14, "amd" should be --and--.

Signed and Sealed this

Twenty-seventh Day of September, 1988

Attest:

DONALD J. QUIGG

*Attesting Officer*   *Commissioner of Patents and Trademarks*